United States Patent [19]

Bernin

[11] 4,300,127
[45] Nov. 10, 1981

[54] SOLID STATE NONCONTACTING KEYBOARD EMPLOYING A DIFFERENTIAL TRANSFORMER ELEMENT

[76] Inventor: Victor M. Bernin, 105 E. Berkshire La., Mt. Prospect, Ill. 60056

[21] Appl. No.: 946,346

[22] Filed: Sep. 27, 1978

[51] Int. Cl.³ .............................................. G06F 3/02
[52] U.S. Cl. .................. 340/365 L; 336/110; 340/365 S
[58] Field of Search .......... 340/365 L, 195, 197, 340/199; 178/17 C; 179/90K; 336/110, 130, 136, 182, 188, 220, 221, 30; 307/115, 113, 112; 400/479.2; 200/67 F, 82 E, 81.9 M, 83 L; 365/62

[56] References Cited

U.S. PATENT DOCUMENTS

| | | | |
|---|---|---|---|
| 3,443,128 | 5/1969 | Fakan | 336/130 |
| 3,522,442 | 8/1970 | Wood | 340/365 L |
| 3,565,014 | 10/1971 | Taylor | 340/365 L |
| 3,573,369 | 4/1971 | Konig et al. | 178/17 C |
| 3,612,241 | 10/1971 | Bernin | 340/365 L |
| 3,623,081 | 11/1971 | Scarbrough | 235/145 |
| 3,638,221 | 1/1972 | Bernin | 340/365 L |
| 3,638,222 | 1/1972 | Bernin | 340/365 L |
| 3,668,697 | 6/1972 | Cochran et al. | 340/365 L |
| 3,683,110 | 8/1972 | Shepard | 340/365 L |
| 3,683,371 | 8/1972 | Holz | 340/365 L |
| 3,698,531 | 10/1972 | Bernin | 340/365 L |
| 3,719,902 | 3/1973 | Esterly | 340/365 L |
| 3,740,746 | 6/1973 | Dureau et al. | 340/365 L |
| 3,745,536 | 7/1973 | Klehm | 364/200 |
| 3,772,684 | 11/1973 | Scantlin | 340/365 L |
| 3,825,909 | 7/1974 | Engstrom et al. | 365/62 |
| 3,836,910 | 9/1974 | Bernin | 340/365 L |
| 3,918,051 | 11/1975 | Bernin et al. | 340/365 L |

FOREIGN PATENT DOCUMENTS

1906117 8/1970 Fed. Rep. of Germany .
897957 6/1962 United Kingdom .

Primary Examiner—James J. Groody
Attorney, Agent, or Firm—Neuman, Williams, Anderson & Olson

[57] ABSTRACT

A solid state noncontacting mechanically actuated keyboard type switch and interconnecting networks for switch arrays are described herein. The basic switch is a balanced or differential transformer element with a movable magnetic core, or shorted turn, actuator which is inserted through one-half of the transformer element, one primary-secondary pair, causing the transformer to change from a balanced or "off" state to an unbalanced or "on" state. The single turn coils that make up the differential transformer element lie in a plane, and in one embodiment of this invention the primary coils and their interconnecting network are printed on one side of a doubled sided printed circuit board, and the secondary coils and their interconnecting network are printed in proper alignment on the opposite side. A hole is provided through the printed circuit board for each transformer element for insertion of a magnetic actuator. Also described is a two dimensional X-Y switch matrix and a three dimensional X-Y-Z switch matrix, for facilitating electronic scanning of the keyboard for implementing encoding, multikey rollover, etc., techniques.

12 Claims, 18 Drawing Figures

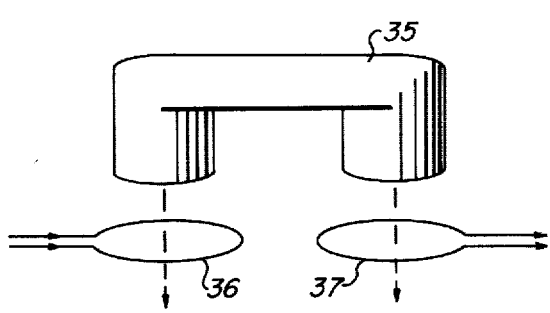
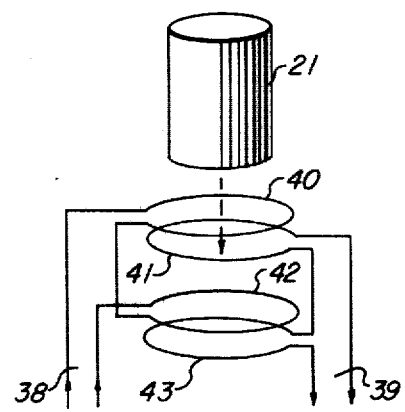
FIG. 9          FIG. 10
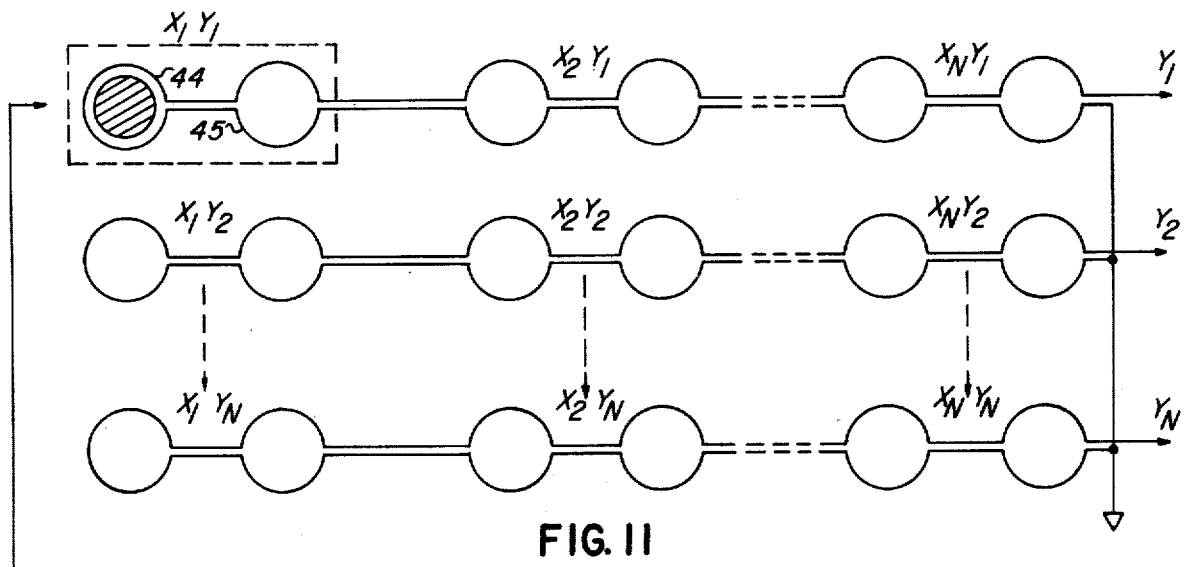
FIG. 11
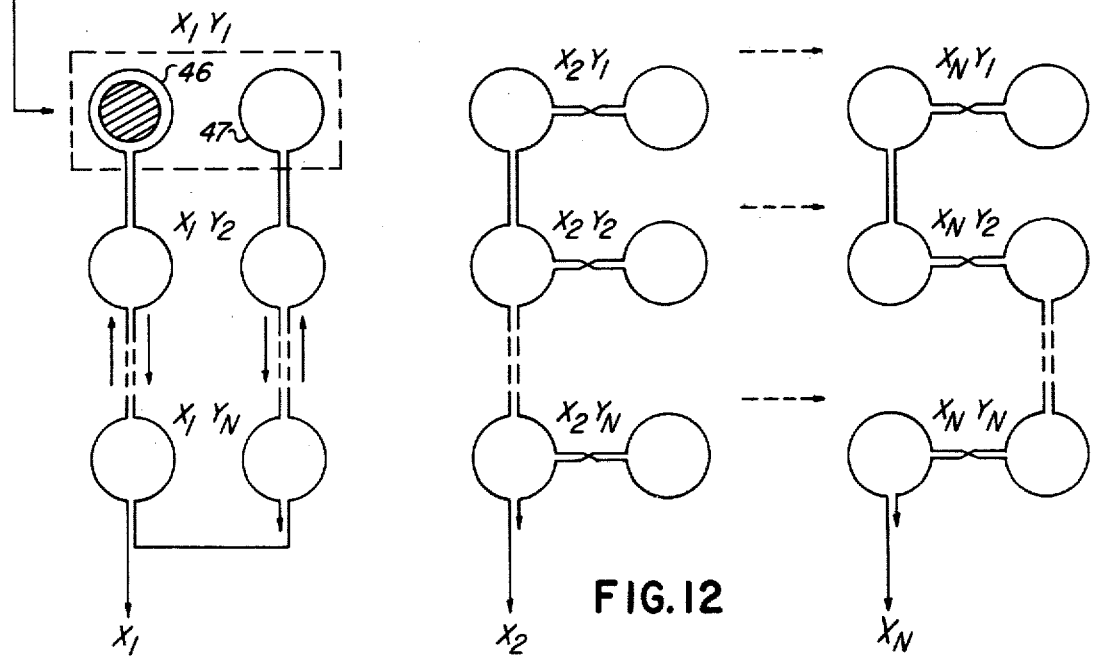
FIG. 12

SOLID STATE NONCONTACTING KEYBOARD EMPLOYING A DIFFERENTIAL TRANSFORMER ELEMENT

BACKGROUND AND SUMMARY OF INVENTION

This invention relates to a solid state noncontacting keyboard employing a differential transformer element and more particularly to a keyboard having a movable actuator for changing the mutual inductance in the primary and secondary windings of the differential transformer element.

In the prior art, keyboards that were used typically in computers, computer terminals, calculators, control panels, telephone devices, etc., were of the mechanical types and more recently solid state noncontacting types. The mechanical types suffered from mechanical wear, corrosion of contacts, etc., which limited their useful life and reliability. The solid state types, which were generally of the electromagnetic, capacitive, photoelectric or Hall Effect types, suffer from various problems including high cost, marginal performance, power consumption, susceptibility to environmental factors, and sometimes reliability. The switch concept described in this invention represents an advancement in the art of keyboard switches in terms of improved performance and reliability, and reduced cost.

The instant invention includes an X-Y matrix and in connection with this matrix, each switch embodies a differential transformer. The basic advantages of this switch concept, stem from its simplicity, its very low cost, high reliability, and due to the high degree of transformer balance that can be maintained on a printed circuit board, a high degree of switch performance in terms of a high on/off ratio or dynamic range is provided.

The prior art did not appreciate the structure, function or advantages of the instant invention. For example, in U.S. Pat. No. 3,668,697, the switch requires a network or element external to the switch to maintain its balance. Other U.S. Patents which deal generally with the subject but fail to indicate the instant invention include Nos. 3,573,369, 3,740,746, 3,745,536 and certain of my U.S. Patents such as Nos. 3,612,241, 3,638,221, 3,638,222, 3,698,531, 3,825,909, 3,836,910 and 3,918,051.

In the preferred embodiment of the present invention, the keyboard is comprised of an array of differential transformer switches, each switch consisting of four identical printed circuit coils, a switch assembly incorporating a switch stem, a return spring, a magnetic core and a key top. When a keyswitch is depressed the magnetic core will be positioned in the center of a primary-secondary coil pair, one half of the differential transformer element, changing the differential transformer from a balanced or "off" state to an unbalanced or "on" state. The two primary coils of the differential transformer element are connected in series opposing and the secondaries in series aiding. When a signal is applied to an undepressed switch the signal will not appear at the output terminals of the switch, since the differential transformer is in a balanced state. Depressing the switch unbalances the transformer permitting a drive or excitation signal to be coupled through to the output terminals of the switch. The two primary coils are printed on one side of a printed circuit board and directly opposite on the other side of the board are printed the secondary coils, with a hole provided through the board through the center of one primary-secondary pair for insertion of the magnetic actuator. The switch assembly or mechanism containing the switch keytop, magnetic core, etc., is then mounted directly above the differential transformer coils. The network which interconnects the secondary coils is printed on the printed circuit board at the same time as the coils. The primary coils and interconnecting network are printed in the same manner.

In the preferred embodiment the keyboard switch array is interconnected and organized into an X-Y matrix in which the primary coils are arranged into columns or drive lines along an X axis, and the secondary coils are arranged into rows or sense lines along a Y axis. This matrix can then be scanned by conventional means for encoding of switches and implementing various multi-key rollover circuits, etc. When implementing an N-Key rollover circuit employing the differential transformer type switch, diodes for isolation purposes are not required as is often the case with this type circuit. The differential transformer type switch is a self-contained and independent type switch, and does not require another switch, external components or circuitry to maintain its balance or perform its function.

DETAILED DESCRIPTION OF THE DRAWINGS

The drawings feature all generally schematic elevational views, some however being partially in section where it is helpful to understand the details of the invention.

FIG. 9 shows a "U" shaped core actuator;

FIG. 10 shows a wireform type differential transformer element;

FIG. 11 shows a secondary interconnection of an X-Y matrix;

FIG. 12 shows the primary coil interconnections in an X-Y matrix;

DETAILED DESCRIPTION OF INVENTION

Basic Switch Element

The basic switch element described in this invention is a differential electromagnetic transformer which can exist in either a balanced or in an unbalanced state. The switch is so designed and structured that a switch actuation will result in changing the switch from a balanced "off" condition to an unbalanced or "on" condition. The differential transformer consists of two identical simple transformers, i.e., a single primary winding and a single secondary winding transformer, with the primary windings interconnected in series opposing and the secondaries in a series aiding configuration. Under these conditions an excitation voltage applied to primary winding of the differential transformer will cancel out in the secondary windings or the output terminals of the transformer element, since the differential transformer is in a balanced state. To unbalance the differential transformer, the electrical characteristics of one of the two simple transformers involved is modified, i.e., their coupling is either increased or decreased. An excitation voltage then applied to the input or primary windings will not cancel out and a signal will appear at the output terminals of the switch. The advantage of a differential transformer over a simple transformer switch configuration is due to the fact that a high degree of balance can be obtained in a printed coil type differential transformer, which translates to a switch with a high on/off ratio or dynamic range which is a desirable switch characteristic. This fact, plus the fact that printed coils are very inexpensive, results in a switch design that is relatively high in performance and low in cost.

Figures 1, 2:
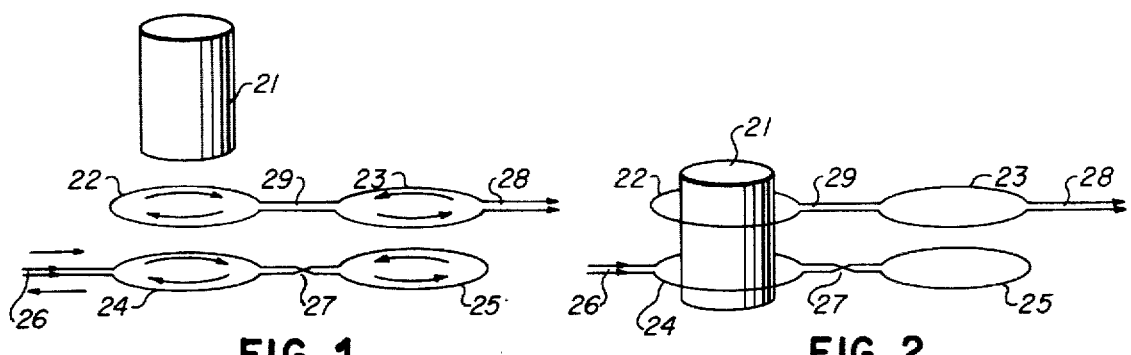
FIG. 1 shows a basic switch element using a ferrite core in the balanced or "off" state.
FIG. 2 is a basic switch element in the unbalanced or "on" state.

FIG. 1 shows a basic differential transformer switch element consisting of a movable ferrite magnetic core 21, two planar or flat primary coils 24 and 25, two planar secondary coils 22 and 23. The two secondary coils are connected in series aiding at 29, and the two primary coils 24 and 25 are connected in series opposing by means of a crossover at 27. An excitation voltage is applied to the primary coils at 26, and the output signal will appear at the secondary output at 28. FIG. 1 shows the switch in a balanced or "off" state since the core 21 does not affect windings 22 and 24.

Figures 3, 4:
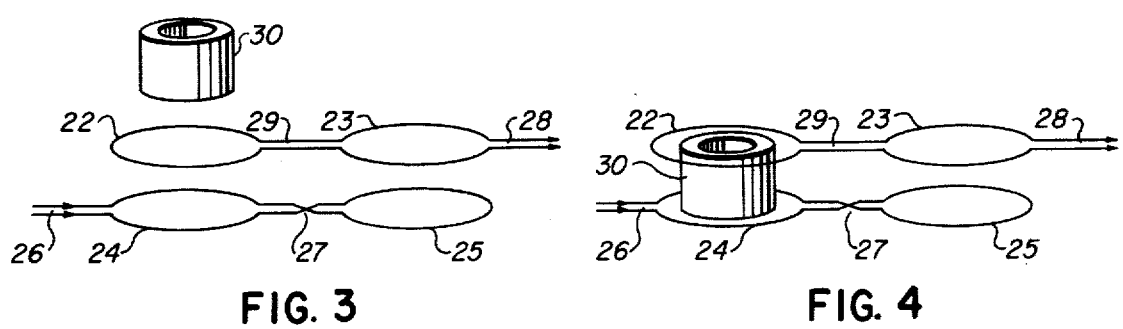
FIG. 3 shows a basic switch element using a shorted turn actuator in the balanced or "off" state.
FIG. 4 shows a basic switch element using a shorted turn actuator in the unbalanced or "on" state.

FIG. 2 shows the switch in an unbalanced or "on" state since the core 21 is in the center of coils 22 and 24 magnetically linking these two coils, thereby increasing their mutual inductance and therefore their coupling. In FIG. 1, the voltage across each coil is equal but of opposite phase and therefore cancel each other. In FIG. 2, the voltage across winding 22 has increased due to the increased coupling between windings 24 and 22, with the result that the two voltages do not cancel each other and a net voltage appears across the output terminals of the differential transformer at 28. FIGS. 3 and 4 show a similar switch configuration except the magnetic core 21 of the preceding views has been replaced by a shorted turn 30. The switch as shown in FIG. 3 is in a balanced state, and the switch as shown in FIG. 4 is in an unbalanced state since the shorted turn is now inside coils 22 and 24. In a shorted turn type switch an unbalance is created by reducing the magnetic coupling between two windings rather than by increasing it by means of a ferrite core. The disadvantage of the use of a shorted turn as compared to a magnetically permeable core such as a ferrite core is the lower output that results, all other conditions being equal.

Figures 5, 6:
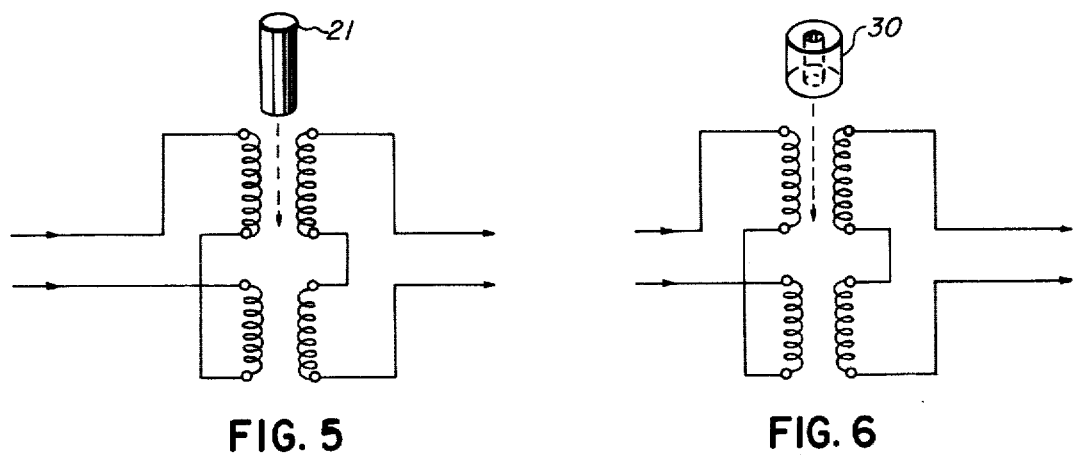
FIG. 5 shows a schematic drawing of a basic switch element using a ferrite core.
FIG. 6 shows a schematic drawing of a basic switch element using a shorted turn actuator.

FIG. 5 is a schematic drawing of a differential transformer switch element as shown in FIGS. 1 and 2 consisting of two simple transformers, and their interconnections in which the phasing of the various windings are taken into account. FIG. 6 is a similar schematic drawing of the shorted turn type switch shown in FIGS. 3 and 4.

Figure 7:
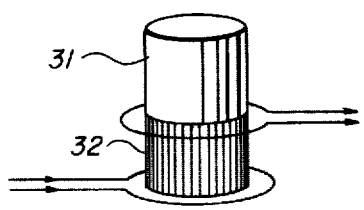
FIG. 7 shows a switch actuator which combines a magnetic core and a shorted turn.
Figure 8:
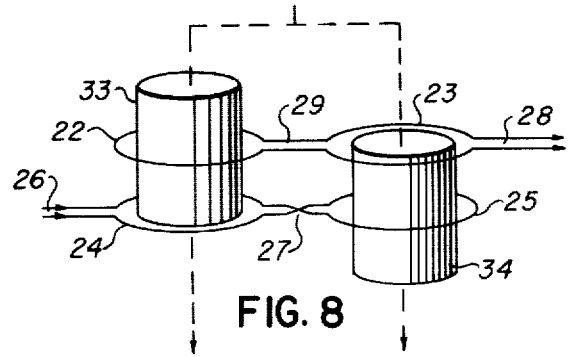
FIG. 8 shows a double core actuator.

FIG. 7 shows an alternate switch design which incorporates an actuator comprising a combined ferrite magnetic core 31 and a shorted turn 32. The advantage of this design is that the range of minimum to maximum coupling for a simple transformer is increased as it moves in and out of a primary/secondary pair of coils as compared to either a magnetic core or a shorted turn alone. FIG. 8 shows a two core actuator comprising the cores 33 and 34, one for each primary/secondary pair. The two cores are asymmetrically positioned, but move together. There is a balance position for the core assembly, and when it moves from this position one core moves further into the coil and the other core moves further out. The advantage of this switch design is that the maximum rate of change in output signal occurs at balance or zero output, and can provide a more sensitive switch with reduced travel.

FIG. 9 shows a simple transformer switch element in which the primary coil 36 lies in the same plane as the secondary coil 37, and a "U" shaped core 35 provides coupling between the two coils. This design provides for minimum coupling between a primary and a secondary coil. FIG. 10 shows the transformer coils from two "wireforms," two secondary coils 41 and 43 in one wireform and two primary coils 40 and 42 in the other. The input connector pins 38 and the output connector pins 39 would either be inserted to a connector, or soldered to a printed circuit board.

Interconnecting Network or Matrix

The differential transformer switch described in this invention is well adapted to various switch matrix designs, which includes an X-Y type scanning matrix. This type matrix provides an efficient and effective means for encoding keyboard switches, and providing various forms of multi-key rollover functions. FIG. 11 shows the manner in which the secondary coils are interconnected and arranged into rows or sense lines along a Y axis, and FIG. 12 shows how the corresponding primary coils are interconnected and arranged into columns or drive lines. The circuit shown in FIG. 11 is superimposed on the circuit shown in FIG. 12, but separated by a non-conductive substrate or insulated board, such that the secondary coils fall on top of their corresponding primary coils, i.e., secondary coil 44 on top of primary coil 46 and 45 on top of 47. This type structure is conveniently formed by printing the primary coils on one side of a printed circuit board and the secondary coils on the opposite side of the printed circuit board. The secondary coils in a given row or sense line are connected in a series aiding configuration, and the primary coils in a given column or drive line are also connected in a series arrangement but with the currents in a given switch oppositely phased. FIG. 12 shows several circuit configurations which will provide oppositely phased primary currents.

Figure 13:
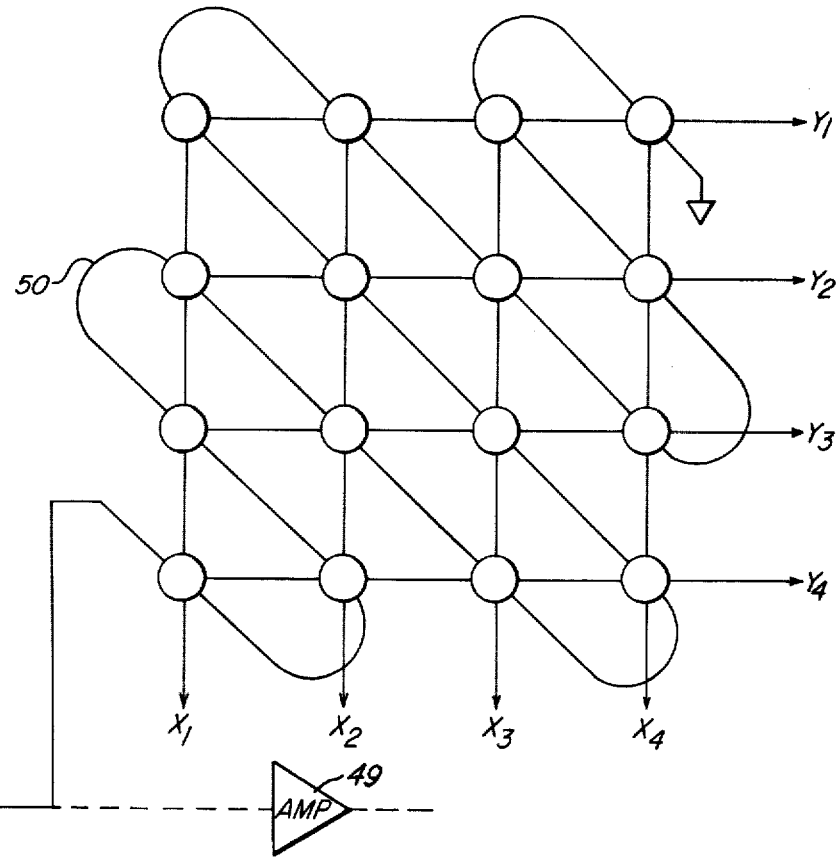
FIG. 13 shows an X-Y-Z matrix interconnection.

FIG. 13 shows a three-dimensional X-Y-Z type matrix. This matrix is built by adding an additional secondary pair to each switch and interconnecting the primary windings in series to form a Z axis 50. The Z axis is excited by a pulse generator 48 resulting in the excitation of a unique X and Y secondary line pair identifying the selected switch in a two-out-of-N coding format. Alternatively, the Z axis line is terminated by a sense amplifier 49 and the X lines scanned in response to the least significant bits of an address signal and the Y lines scanned in response to the most significant bits of the address signal. With the X and Y drive pulses phase displaced with respect to one another double pulses will appear on the Z axis line identifying actuated switches.

Construction of Transformer Coils and Interconnecting Network

The transformer coils and their interconnecting network are constructed in a planar form, i.e., the coils and network lie flat in a plane. The purpose of constructing these circuits in this manner is that it allows for very low cost fabrication techniques to be employed, principally printed circuit board and thick film screening techniques. An additional benefit from these techniques is that highly accurate and highly repeatable conductive patterns are provided which translates into highly balanced differential transformers and threfore switches with a high on/off signal ratio or dynamic range.

The primary and secondary circuits lie in separate but parallel planes and generally as close as possible to one another. In a double sided printed circuit board design, the primary and secondary circuit patterns are printed on opposite sides of the same board. Thick film screening techniques allow the two patterns to be screened on opposite sides of a board or on the same side. The paired primary and secondary coils lie on the same axis and holes are provided through the board centered on the paired coils as required for the insertion of a magnetic switch actuator.

Other fabrication techniques can be employed. The various sense and drive lines, as an example, can be formed from conductive wires into "wireforms." These wireforms can then be snapped into position at the base of appropriately designed switch housings. Instead of wireforms, thin metal strips can be punched to form the correct circuit patterns and similarly snapped into an appropriately designed switch housing. Wire wrapping is another available construction technique. Wires can be wrapped around the base of appropriately designed switch housings to form the coils, and then routed with wires to the next switch position to form the interconnecting network.

Switch Structure Design

Figure 14:
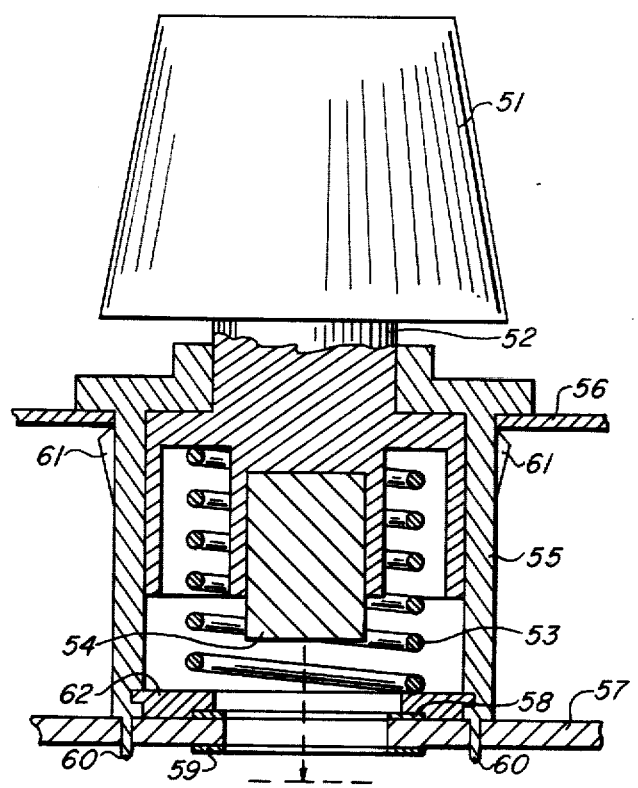
FIG. 14 shows a module switch structure design.
Figure 15:
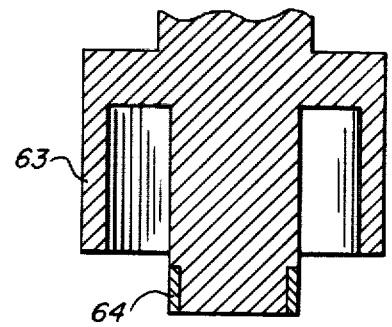
FIG. 15 shows a stem design utilizing a shorted turn.

FIG. 14 shows a switch module design which consists of a keycap or button 51, a keystem 52 which moves in a vertical axis and incorporating a ferrite magnetic core 54, a switch housing 55, a return spring 53, and a snap-in retainer 62. The switch housing 55 includes snap in tabs 61 and snaps into a chassis 56, and guide pins 60 locate the housing 55 on the printed circuit board 57. The printed circuit board 57 has primary coils 59 printed on the bottom side and secondary coils 58 printed on the top side of the printed circuit board 57. When the switch is actuated the button 51 is depressed thereby moving the switch stem 52 downward such that the magnetic core 54 is positioned inside the primary and secondary coils 58 and 59. FIG. 15 shows a keystem 63 which incorporates a shorted turn 64 instead of a magnetic core.

Figure 16:
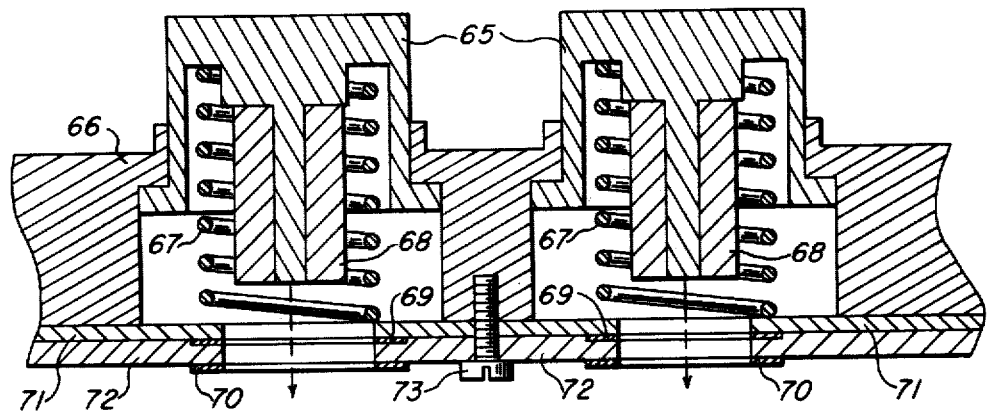
FIG. 16 shows a non-modular switch design employing a magnetic core.
Figure 17:
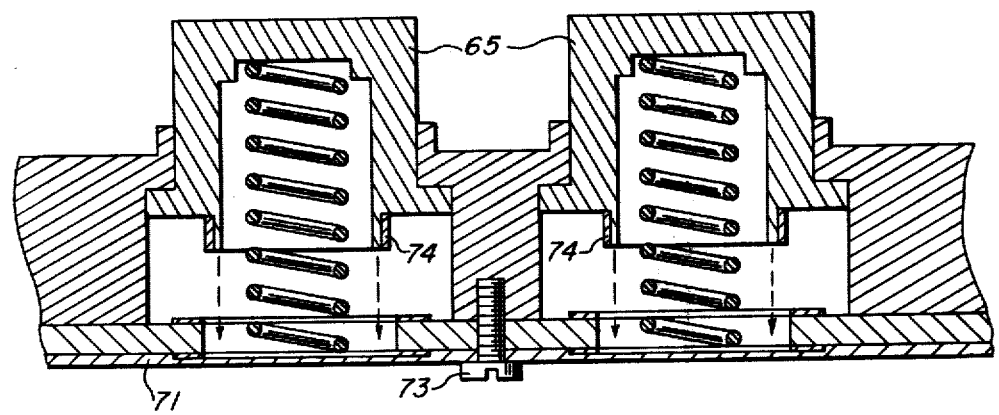
FIG. 17 shows a non-modular switch design employing a shorted turn actuator.

FIG. 16 shows a non-modular switch design which consists of a common housing or base 66, switch key-top/stem combinations 65, return springs 67, magnetic cores 68, a spring retainer plate 71, and an attached printed circuit board 72, with printed circuit secondary coils 69, and primary printed circuit coils 70, a machine screw 73 for holding the assembly together. FIG. 17 shows a similar design except that the switch button/stems 65 incorporate shorted turns 74 instead of magnetic cores.

Interface Circuitry For Electronic Scanning

Figure 18:
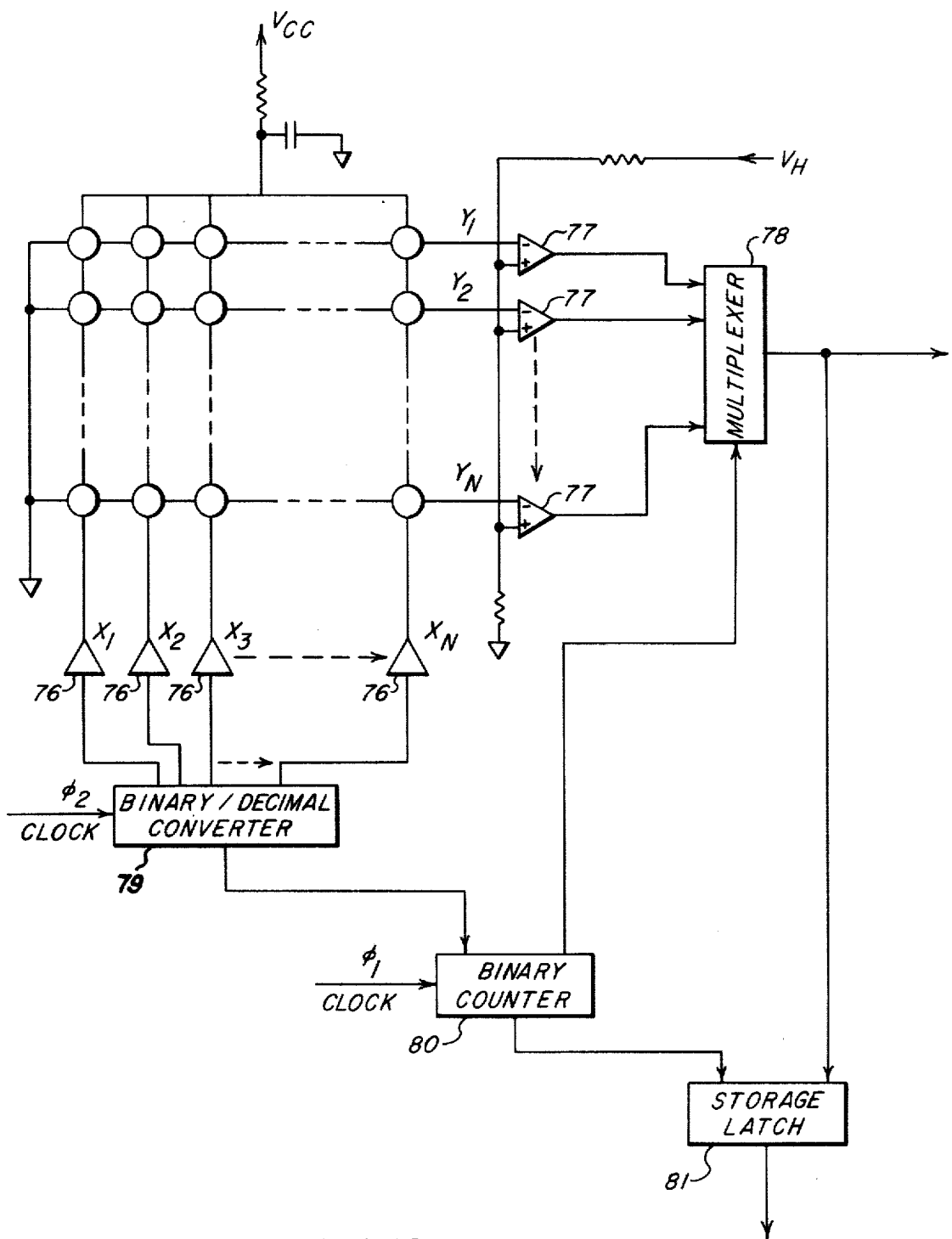
FIG. 18 shows a functional block diagram of a scanning type circuit.

FIG. 18 shows an array of keyboard switches organized into a two dimensional X-Y matrix, and interface circuitry for sequentially scanning through the switches in the matrix. This is a conventional and most effective means for encoding the switches and providing various multi-key rollover functions. The drive lines $X_1$ through $X_n$ are sequentially scanned by current pulses from the binary to decimal converter 79 in response to the least significant bits of timing information contained in binary counter 80, and the sense lines $Y_1$ through $Y_n$ are scanned by the multiplexer 78, in response to the most significant bits of the same timing information. The basic timing information is provided by the binary counter 80 which is advanced by clock pulses. The output from the multiplexer 78 is a single channel signal, and an output pulse will appear for each keyswitch depressed in the matrix in each frame interval. A frame interval is defined as the period required to scan once through the matrix. Each output pulse from the multiplexer 78 will occupy a unique time slot in the frame interval corresponding to a unique code from the binary counter 80. In order to store a code corresponding to the selected switch, the binary code from the binary counter 80 is coupled to a latch 81, and the signal from the multiplexer 78 will transfer the correct code at the proper time to the latch 81.

The binary-to-decimal decoder 79 converts the binary code to decimal outputs which are in turn coupled to current drive amplifiers 76. The sense amplifiers 77 amplify the signals from the matrix before being coupled to the multiplexer 78. Differential inputs to the sense amplifiers 77 provide a means for coupling in a hysteresis feedback pulse, which is required by an analog switch such as the differential transformer type switch. Additional circuitry will be required in order to implement multikey rollover functions, where more than one keyswitch may be depressed simultaneously, and hysteresis. However, this circuitry is well known to those of ordinary skill in the art and will not be described in detail herein.

I claim:

1. A differential transformer switch comprising two primary windings which lie in a first plane and two secondary windings which lie in a second plane parallel and in close proximity to said first plane, said windings being positioned such that each primary winding is opposite to and aligned with one of said secondary windings to define first and second primary-secondary winding pairs, said primary windings being interconnected in said first plane and said secondary windings being interconnected in said second plane to form a differential transformer configuration wherein the output signal voltage from the interconnected secondary windings represents the difference in the magnetic coupling between said first and second primary-secondary winding pairs and a mutual inductance changing member which is movable from a position outside a common winding bore defined by one of said primary-secondary winding pairs to a position within said bore to effect a change in mutual inductance and hence the coupling of said one of said primary-secondary winding pairs with a resulting change in the balance of the differential transformer and the signals coupled by the primary-secondary winding pairs which signifies a switching operation.

2. The switch of claim 1 comprising a circuit board having two substantially parallel surfaces with the primary windings being fixedly applied to one surface and with the secondary windings being fixedly applied to the other surface and in which the movable inductance changing member reciprocates within a circuit board aperture.

3. The switch of claim 1 in which only one of the two primary-secondary winding pairs has a mutual inductance changing member.

4. The switch of claim 1 in which each primary and secondary winding is a single turn.

5. The combination of claim 1 in which the movable mutual inductance changing member is an electrically-conductive shorted-turn element concentric with the windings of the one primary-secondary winding pair.

6. The combination of claim 1 in which the movable mutual inductance changing member comprises a magnetically permeable core affixed to a shorted-turn element.

7. A differential transformer switch comprising two primary windings which lie in a common first plane and two secondary windings which lie in a common second plane parallel and in close proximity to said first plane, each of said primary windings being associated with one of said secondary windings in an opposing adjacent relationship with one another on a common axis to define two primary-secondary winding pairs, said primary windings being interconnected and said secondary windings being interconnected and electrically phased to form a differential transformer configuration wherein the output signal voltage from the interconnected secondary windings represents the difference between the signals coupled by the two primary-secondary winding pairs, and a movable mutual inductance changing member which is movable relative to the common winding bore defined by one primary-secondary winding pair to effect a change in mutual inductance with a resulting change in the balance of the differential transformer and the signals coupled by the primary-secondary winding pairs which signify a switching operation.

8. The switch of claim 7 comprising a circuit board having two substantially parallel surfaces with the primary windings being fixedly applied to one surface and with the secondary windings being fixedly applied to the other surface and in which the movable inductance changing member reciprocates within a circuit board aperture.

9. The switch of claim 7 in which the mutual inductance changing member is a pair of magnetic permeable members each of which reciprocates within an aperture located in the bore of a different primary-secondary winding pair, said magnetic permeable members being asymmetrically positioned relative to said first and second planes.

10. A keyboard including a circuit board having two substantially parallel planar surfaces comprising: an array of differential transformer switches; each switch having a pair of flat primary windings which lie in a common plane on one planar surface of the circuit board and a pair of flat secondary windings which lie in a separate plane on the second planar surface of the circuit board parallel to and in close proximity with the primary winding plane and with all windings positioned so that each primary winding is associated with a different secondary winding in an opposing adjacent relationship with one another on a common axis to define two primary-secondary winding pairs, said primary windings and secondary windings being interconnected and electrically phased to form a differential transformer configuration wherein the output signal voltage from the interconnected secondary windings represents the difference in the excitations coupled from the primary windings, and a movable mutual inductance changing member which is movable from a position outside the common winding bore defined by one primary-secondary winding pair to a position within said bore defined by a circuit board aperture to effect a change in mutual inductance with a resulting change in the balance of the differential transformer which signifies a switch operation; and the array of switches being electrically interconnected to form a two dimensional X-Y switch matrix by connecting the output terminals of the switches in row sense lines which have a unique position along a Y axis and by connecting the input terminals in column drive lines which have a unique position along an X axis.

11. The keyboard of claim 10 in which each row sense line is formed by a series connection of all of the secondary windings of the switches in that row, and in which each column drive line is formed by a series connection of all of the primary windings of the switches in that column.

12. An electrical switch comprising a transformer having a first primary winding which lies in a first plane and a first secondary winding which lies in a second plane parallel and in close proximity to said first plane, and a second primary winding which lies in said first plane and a second secondary winding which lies in said second plane, said windings being positioned such that said first primary winding is opposite to and aligned with said first secondary winding and said second primary winding is opposite to and aligned with said second secondary winding, said primary windings being interconnected in said first plane and said secondary windings being interconnected in said second plane to form a differential transformer, and a mutual inductance changing member which is movable from a position outside a common winding bore aligned with said first primary and secondary windings to a position within said bore to effect a change in mutual inductance between said first primary and secondary windings and the signals coupled thereby to signify a switching operation.

* * * * *